(12) United States Patent
Terai

(10) Patent No.: US 10,886,411 B2
(45) Date of Patent: Jan. 5, 2021

(54) SEMICONDUCTOR DEVICE AND DISPLAY UNIT

(71) Applicant: JOLED INC., Tokyo (JP)

(72) Inventor: Yasuhiro Terai, Tokyo (JP)

(73) Assignee: JOLED INC., Tokyo (JP)

( * ) Notice: Subject to any disclaimer, the term of this patent is extended or adjusted under 35 U.S.C. 154(b) by 14 days.

(21) Appl. No.: 16/174,284

(22) Filed: Oct. 30, 2018

(65) Prior Publication Data

US 2019/0165183 A1    May 30, 2019

(30) Foreign Application Priority Data

Nov. 30, 2017   (JP) .................................. 2017-230723

(51) Int. Cl.
| | |
|---|---|
| *H01L 27/14* | (2006.01) |
| *H01L 29/786* | (2006.01) |
| *H01L 27/32* | (2006.01) |
| *H01L 51/00* | (2006.01) |
| *H01L 27/12* | (2006.01) |

(52) U.S. Cl.
CPC .... *H01L 29/78648* (2013.01); *H01L 27/1255* (2013.01); *H01L 27/3276* (2013.01); *H01L 29/7869* (2013.01); *H01L 51/0097* (2013.01); *H01L 27/3262* (2013.01); *H01L 27/3265* (2013.01)

(58) Field of Classification Search
CPC ............. H01L 27/3262; H01L 27/3265; H01L 27/1237; H01L 29/78648
See application file for complete search history.

(56) References Cited

U.S. PATENT DOCUMENTS

| | | | | |
|---|---|---|---|---|
| 2010/0255618 A1* | 10/2010 | Choi | ................. | H01L 21/76254 438/29 |
| 2015/0014641 A1* | 1/2015 | Jung | ................... | H01L 27/3262 257/40 |
| 2016/0204266 A1* | 7/2016 | Seo | .................... | H01L 29/78618 257/43 |
| 2017/0053951 A1 | 2/2017 | Sato | | |

(Continued)

FOREIGN PATENT DOCUMENTS

| | | |
|---|---|---|
| JP | 201741527 A | 2/2017 |
| JP | 2017-49568 A | 3/2017 |

*Primary Examiner* — Phuc T Dang
(74) *Attorney, Agent, or Firm* — Hauptman Ham, LLP

(57) ABSTRACT

A semiconductor device includes a substrate, a transistor, a storage capacitor, a first insulating layer, and a second insulating layer. The transistor includes a semiconductor film, a gate insulating film, a first gate electrode, and a second gate electrode. The semiconductor film, the gate insulating film, and the first gate electrode are provided in this order from the substrate. The second gate electrode faces the first gate electrode across the semiconductor film. The storage capacitor includes a lower electrode and an upper electrode that are provided in this order from the substrate. The upper electrode faces the lower electrode and includes the same material as the semiconductor film. The first insulating layer is provided between the second gate electrode and the semiconductor film. The second insulating layer is provided between the lower electrode and the upper electrode and has a smaller thickness than the first insulating layer.

11 Claims, 6 Drawing Sheets

(56) References Cited

U.S. PATENT DOCUMENTS

| | | | |
|---|---|---|---|
| 2017/0236949 A1* | 8/2017 | Yamazaki | H01L 27/1225 257/43 |
| 2018/0026232 A1* | 1/2018 | Xiao | H01L 51/5256 257/40 |
| 2018/0190672 A1* | 7/2018 | Lee | H01L 25/0753 |

* cited by examiner

SEMICONDUCTOR DEVICE AND DISPLAY UNIT

CROSS REFERENCE TO RELATED APPLICATIONS

This application claims the benefit of Japanese Priority Patent Application No. 2017-230723 filed on Nov. 30, 2017, the entire contents of which are incorporated herein by reference.

BACKGROUND

The technology relates to a semiconductor device including a transistor and a storage capacitor that are provided on a substrate, and a display unit including such a semiconductor device.

A semiconductor device including a thin-film transistor (TFT) and a storage capacitor has found its application in a variety of electric apparatuses. A TFT includes a semiconductor film on a substrate. To suppress a characteristic fluctuation of such a TFT, an electrically-conductive film is provided between the substrate and the semiconductor film, as disclosed in Japanese Unexamined Patent Application Publications No. 2017-49568, for example.

SUMMARY

For a semiconductor device that includes a transistor and a storage capacitor, it has been desired to suppress a characteristic fluctuation of the transistor while increasing the capacitance of the storage capacitor.

It is desirable to provide a semiconductor device that is able to suppress a characteristic fluctuation of a transistor while increasing the capacitance of a storage capacitor, and a display unit including such a semiconductor device.

A semiconductor device according to one embodiment of the technology includes: a substrate; a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film; a storage capacitor including a lower electrode and an upper electrode, the lower electrode and the upper electrode being provided in this order from the substrate, the upper electrode facing the lower electrode and including a material the same as a material of the semiconductor film; a first insulating layer provided between the second gate electrode and the semiconductor film; and a second insulating layer provided between the lower electrode and the upper electrode and having a thickness smaller than a thickness of the first insulating layer.

A display unit according to one embodiment of the technology is provided with a semiconductor device and a display element layer that is configured to be driven by the semiconductor device. The semiconductor device includes a substrate; a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film; a storage capacitor including a lower electrode and an upper electrode, the lower electrode and the upper electrode being provided in this order from the substrate, the upper electrode facing the lower electrode and including a material the same as a material of the semiconductor film; a first insulating layer provided between the second gate electrode and the semiconductor film; and a second insulating layer provided between the lower electrode and the upper electrode and having a thickness smaller than a thickness of the first insulating layer.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
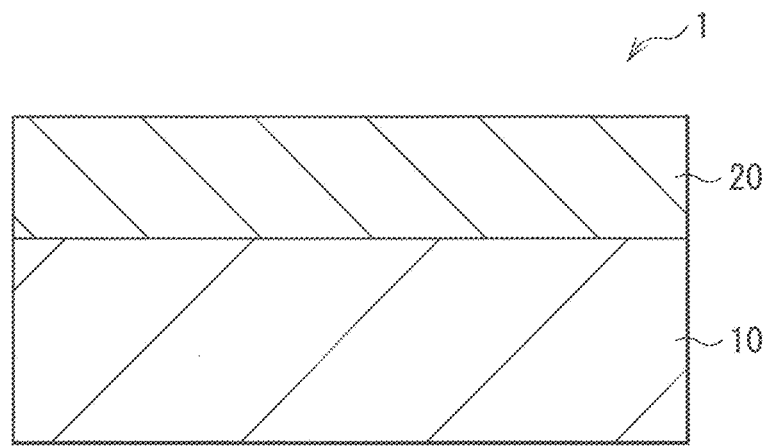
FIG. 1 is a schematic cross-sectional view of a display unit having an example configuration according to one embodiment of the technology.

In the following, some example embodiments of the technology are described in detail, in the following order, with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. Embodiments (Display Unit Including Second Insulating Layer Having Smaller Thickness than First Insulating Layer)
2. Modification Examples (Source-drain Electrode Provided in Layer Upper than Semiconductor Film)
3. Example Configurations of Display Unit
4. Example Imaging Units
5. Example Electronic Apparatuses

EMBODIMENTS

[Configuration]

FIG. 1 is a schematic cross-sectional view of a display unit 1 having an example configuration according to one embodiment of the technology. The display unit 1 includes a semiconductor device 10 and a display element layer 20 provided on the semiconductor device 10. The display unit 1 may be an organic electroluminescent (EL) unit, for example.

Figure 2:
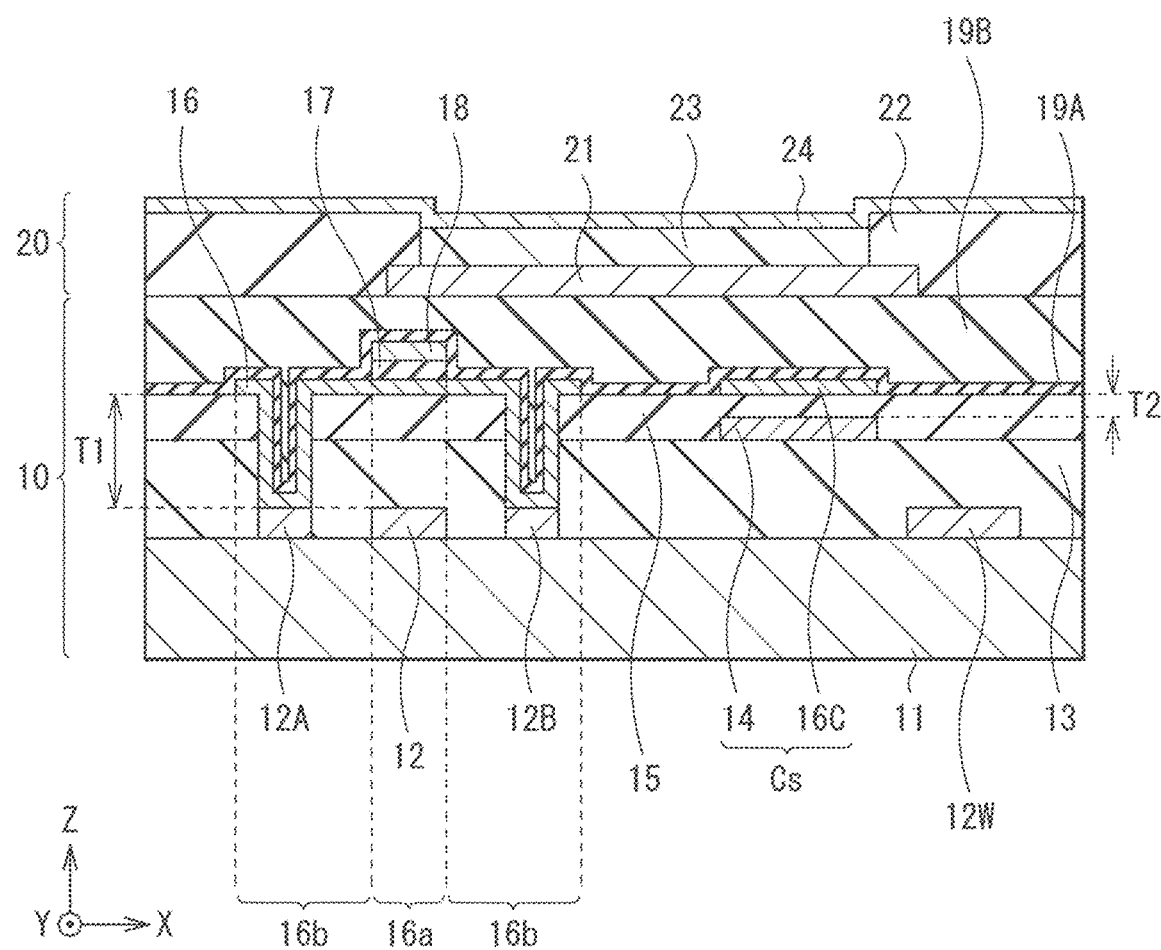
FIG. 2 is a schematic cross-sectional view of main parts of a semiconductor device and a display element layer having an example configuration according to one embodiment of the technology.

FIG. 2 is a schematic cross-sectional view of main parts of the semiconductor device 10 and the display element layer 20 each having an example configuration.

The semiconductor device 10 includes a thin-film transistor Tr and a storage capacitor Cs on the substrate 11. The transistor Tr may be a top-gate thin-film transistor. The transistor Tr includes, in order from the substrate 11, a semiconductor film 16, a gate insulating film 17, and a first gate electrode 18. The transistor Tr further includes a second gate electrode 12 and source-drain electrodes 12A and 12B. The second gate electrode 12 faces the first gate electrode 18 across the semiconductor film 16. The source-drain electrodes 12A and 12B are electrically coupled to the semiconductor film 16. An organic insulating film 13 and an inorganic insulating film 15 are provided between the second gate electrode 12 and the semiconductor film 16. The first gate electrode 18 may be covered with a protective film 19A and a planarizing film 19B. The storage capacitor Cs includes, in order from the substrate 11, a lower electrode 14 and an upper electrode 16C. The inorganic insulating film 15 may be provided between the lower electrode 14 and the upper electrode 16C.

The display element layer 20 may include, in order from the semiconductor device 10, a first electrode 21, an element separation film 22, an organic layer 23, and a second electrode 24, for example.

The substrate 11 may be a flexible substrate, for example. The substrate 11 may include a resin material, such as polyethylene terephthalate (PET), polyimide (PI), polycarbonate (PC), polyethylene naphthalate (PEN), polyamide, spin-on-glass (SOG), or polyethersulfone (PES). Alternatively, the substrate 11 may be a metal film, such as a stainless steel (SUS) film, that is provided with an insulating material thereon. Alternatively, the substrate 11 may include a rigid material, such as glass.

[Transistor Tr]

The second gate electrode 12 may be provided on a selective region on the substrate 11. In an example embodiment of the technology, the second gate electrode 12 may have a planar shape substantially the same as that of the first gate electrode 18 on an X-Y plane of FIG. 2. The second gate electrode 12 may have end faces that are substantially aligned with respective end faces of the first gate electrode 18. In other words, the first gate electrode 18 may be overlaid above the second gate electrode 12 in plan view. In an alternative embodiment of the technology, the second gate electrode 12 may extend over a larger region than the first gate electrode 18 in plan view. The second gate electrode 12 may be constantly held at a fixed potential. For example, the second gate electrode 12 may be held at a ground (GND) potential of 0 volts. Such a second gate electrode 12 suppresses a characteristic fluctuation of the transistor Tr. For example, the second gate electrode 12 suppresses a fluctuation in saturation current due to a drain voltage (Vd)-drain current (Id) characteristic.

The second gate electrode 12 may include a metal including one of titanium (Ti), tungsten (W), tantalum (Ta), aluminum (Al), molybdenum (Mo), gold (Au), silver (Ag), neodymium (Nd), or copper (Cu), or a metal alloy thereof, for example. Alternatively, the second gate electrode 12 may be a transparent electrically-conductive film. The transparent electrically-conductive film may include an oxide semiconductor containing, as a main component, an oxide of one or more of indium, gallium, zinc, tin, titanium, or a niobium, for example. The second gate electrode 12 may be a single-layer film or a multilayer film. The second gate electrode 12 may have a thickness in a range from 10 nm to 1,000 nm, for example.

In an example embodiment of the technology, the source-drain electrodes 12A and 12B may be formed in the same process and provided in the same layer as the second gate electrode 12. Each of the source-drain electrodes 12A and 12B may include a material the same as the material of the second gate electrode 12, and have a thickness substantially the same as the thickness of the second gate electrode 12. A wiring line 12W may be provided in the same layer including the second gate electrode 12 and the source-drain electrodes 12A and 12B.

The organic insulating film 13 may extend over the entire top surface of the substrate 11 and cover the second gate electrode 12, the source-drain electrodes 12A and 12B, and the wiring line 12W. For example, the organic insulating film 13 may planarize the top surface of the substrate 11 on which the second gate electrode 12 is provided. The organic insulating film 13 may include an organic insulating material, such as an acrylic resin, polyimide (PI), novolak-based resin, or a siloxane compound, for example. Such an organic insulating material is readily formed into a thick film. For example, the organic insulating film 13 may have a thickness in a range from 0.8 μm to 20 μm. The organic insulating film 13 defines a sufficient distance between the second gate electrode 12 and the semiconductor film 16.

The inorganic insulating film 15 may be provided between the organic insulating film 13 and the semiconductor film 16, and may be in contact with a lower face of the semiconductor film 16. The inorganic insulating film 15 may extend over the entire top surface of the substrate 11. The inorganic insulating film 15 may have a proper interface between the inorganic insulating film 15 and the semiconductor film 16. The inorganic insulating film 15 may be a single-layer film or a multilayer film that includes one or more of silicon oxide ($SiO_x$), silicon nitride (SiN), silicon oxide nitride (SiON), and phosphorus-doped silicon oxide (SiO:P), for example. Alternatively, the inorganic insulating film 15 may include aluminum oxide (Al$_2$O$_3$). The inorganic insulating film 15 may have a thickness in a range from 30 nm to 500 nm, for example.

Through-holes respectively extending to the source-drain electrodes 12A and 12B may be provided in the organic insulating film 13 and the inorganic insulating film 15 that face the source-drain electrodes 12A and 12B. The through holes may each correspond to a specific but non-limiting example of a "contact hole" according to one embodiment of the technology.

The semiconductor film 16 may face the second gate electrode 12 across the organic insulating film 13 and the inorganic insulating film 15. In other words, the organic insulating film 13 and the inorganic insulating film 15 may be provided between the semiconductor film 16 and the second gate electrode 12. A combination of the organic insulating film 13 and the inorganic insulating film 15 may correspond to a specific but non-limiting example of a "first insulating layer" according to one embodiment of the technology. The first insulating layer may have a thickness T1 that is a total thickness of the organic insulating film 13 and the inorganic insulating film 15. The thickness T1 may be in a range from 0.83 μm to 20.5 μm, for example. Although described in detail below, the first insulating layer (i.e., the combination of the organic insulating film 13 and the inorganic insulating film 15) having the sufficiently large thickness T1 suppresses a defect that may possibly be caused by the second gate electrode 12 and the semiconductor film 16 provided close to each other.

The semiconductor film 16 may be provided in a selective region on the inorganic insulating film 15. The semiconductor film 16 may have a channel region 16a and low-resistive regions 16b. The channel region 16a may be provided so as to face the first gate electrode 18 and the second gate electrode 12. The low-resistive regions 16b may be respectively provided on two sides of the channel region 16a. The low-resistive regions 16b may each have an electric resistance lower than that of the channel region 16a. The low-resistive regions 16b of the semiconductor film 16 may be electrically coupled to the respective source-drain electrodes 12A and 12B via the respective through-holes of the inorganic insulating film 15 and the organic insulating film 13.

The semiconductor film 16 may include an oxide semiconductor containing, as a main component, an oxide of one or more of indium (In), gallium (Ga), zinc (Zn), tin (Sn), titanium (Ti), and neodymium (Nb), for example. Specific but non-limiting examples of the oxide semiconductor may include indium-tin-zinc-oxide (ITZO), indium-gallium-zinc-oxide (IGZO: InGaZnO), zinc oxide (ZnO), indium-zinc oxide (IZO), indium-gallium-oxide (IGO), indium-tin-oxide (ITO), and indium oxide (InO). Alternatively, the semiconductor film 16 may include low-temperature polycrystalline silicon (LTPS) or amorphous silicon (a-Si), for example.

The gate insulating film 17 may be provided between the semiconductor film 16 and the first gate electrode 18. The gate insulating film 17 may be provided in a selective region on the semiconductor film 16, and may be overlaid on the channel region 16a of the semiconductor film 16. The gate insulating film 17 may have a planar shape substantially the same as that of the first gate electrode 18 on the X-Y plane of FIG. 2, for example. The gate insulating film 17 may have end faces that are substantially aligned with the respective end faces of the first gate electrode 18 in plan view. Namely, the transistor Tr may have a self-aligned structure. The gate insulating film 17 may be a single-layer film including one of silicon oxide (SiO$_x$), silicon nitride (SiN$_x$), silicon oxide nitride (SiON), and aluminum oxide (AlO$_x$), or a multilayer film including two or more thereof.

The first gate electrode 18 may face the channel region 16a of the semiconductor film 16 across the gate insulating film 17. The first gate electrode 18 may control a carrier density in the semiconductor film 16 with a gate voltage (Vg) applied thereto, and serve as a wiring line that supplies potential. The first gate electrode 18 may include a metal including one of titanium (Ti), tungsten (W), tantalum (Ta), aluminum (Al), molybdenum (Mo), silver (Ag), neodymium (Nd), or copper (Cu), or a metal alloy thereof, for example. Alternatively, the first gate electrode 18 may include a compound including one or more of these elements or may be a multilayer film including two or more of the elements. The first gate electrode 18 may be a transparent electrically-conductive film including indium tin oxide (ITO), for example.

The protective film 19A may extend over the entire top surface of the substrate 11 to cover the first gate electrode 18, and may be in contact with the low-resistive regions 16b of the semiconductor film 16, for example. The protective film 19A may be an aluminum oxide (Al$_2$O$_3$) film, for example. The protective film 19A in contact with the low-resistive regions 16b stably holds the electric resistance of the low-resistive regions 16b.

The planarizing film 19B may extend over the entire top surface of the substrate 11 to cover the protective film 19A covering the first gate electrode 18. The planarizing film 19B may planarize the top surface of the substrate 11 on which the transistor Tr and the storage capacitor Cs are provided. The planarizing film 19B may include an organic insulating material, such as acrylic resin, polyimide (PI), epoxy resin, or novolak resin, for example. Alternatively, the planarizing film 19B may include an inorganic material, such as silicon oxide, silicon nitride, silicon oxide nitride, or aluminum oxide.

[Storage Capacitor Cs]

The storage capacitor Cs may be provided in a different region from the transistor Tr. For example, the lower electrode 14 and the upper electrode 16C may be provided so as not to overlap the semiconductor film 16 in plan view.

The lower electrode 14 may be provided in a selective region on the organic insulating film 13. The lower electrode 14 may include a metal including titanium (Ti), tungsten (W), tantalum (Ta), aluminum (Al), molybdenum (Mo), gold (Au), silver (Ag), neodymium (Nd), or copper (Cu), or a metal alloy thereof, for example. Alternatively, the lower electrode 14 may be a transparent electrically-conductive film. The lower electrode 14 may have a thickness in a range from 10 nm to 1,000 nm, for example.

The upper electrode 16C faces the lower electrode 14 across the inorganic insulating film 15. In other words, the inorganic insulating film 15 is provided between the upper electrode 16C and the lower electrode 14. The inorganic insulating film 15 may correspond to a specific but non-limiting example of a "second insulating layer" according to one embodiment of the technology. The second insulating layer may have a thickness T2 that is the thickness of the inorganic insulating film 15. The thickness T2 may be in a range from 30 nm to 500 nm, for example. In an example embodiment of the technology, only the inorganic insulating film 15 is provided between the upper electrode 16C and the lower electrode 14, and the organic insulating film 13 and the inorganic insulating film 15 are provided between the second gate electrode 12 and the semiconductor film 16, as described above. Although described in detail below, the thickness T2 of the second insulating layer (i.e., inorganic insulating film 15) provided between the upper electrode 16C and the lower electrode 14 may be smaller than the thickness T1 of the first insulating layer (i.e., the combination of the organic insulating film 13 and the inorganic insulating film 15). Such a configuration increases the capacitance of the storage capacitor Cs.

The upper electrode 16C may include a material substantially the same as the material of the semiconductor film 16. For example, the upper electrode 16C may include a low-resistive semiconductor material. The semiconductor material may be an oxide semiconductor material, low-temperature polycrystalline silicon (LTPS), or amorphous silicon (a-Si), for example. In an example embodiment of the technology, the upper electrode 16C may be provided in the same process and provided in the same layer as the semiconductor film 16. The upper electrode 16C may have a thickness substantially the same as the thickness of each of the low-resistive regions 16b of the semiconductor film 16. The upper electrode 16C may be covered with the protective film 19A and the planarizing film 19B.

[Display Element Layer 20]

The display element layer 20 may include a plurality of pixels and display elements that are driven to display an image by a backplane provided with the transistors Tr. The display elements may be organic EL elements, for example. Each of the organic EL elements may include, in order from the semiconductor device 10, the first electrode 21, the organic layer 23 including a light-emitting layer, and the second electrode 24, for example. Each two adjacent organic EL elements may be separated by the element separation film 22. The element separation film 22 may be provided on the first electrode 21 and have an opening in which a middle portion of the first electrode 21 is exposed. The organic layer 23 may be provided on the exposed middle portion of the first electrode 21. The first electrode 21 may be electrically coupled to corresponding one of the transistors Tr, which is not illustrated in the drawings. The second electrode 24 may supply a common cathode potential to the pixels through respective wiring lines WL2 described below, for example. For example, the second electrode 24 may be common among the pixels.

Optionally, a non-illustrated metal thin film may be attached to a rear face of the substrate 11. The rear face of the substrate 11 is opposite to the surface facing the display element layer 20. In an example embodiment in which the substrate 11 is a flexible substrate including an organic material, the metal thin film may be attached to the rear face of the substrate 11 to protect and reinforce the substrate 11. In another example embodiment in which the substrate 11 is a metal film or a glass film, the metal thin film may be omitted.

Figure 3:
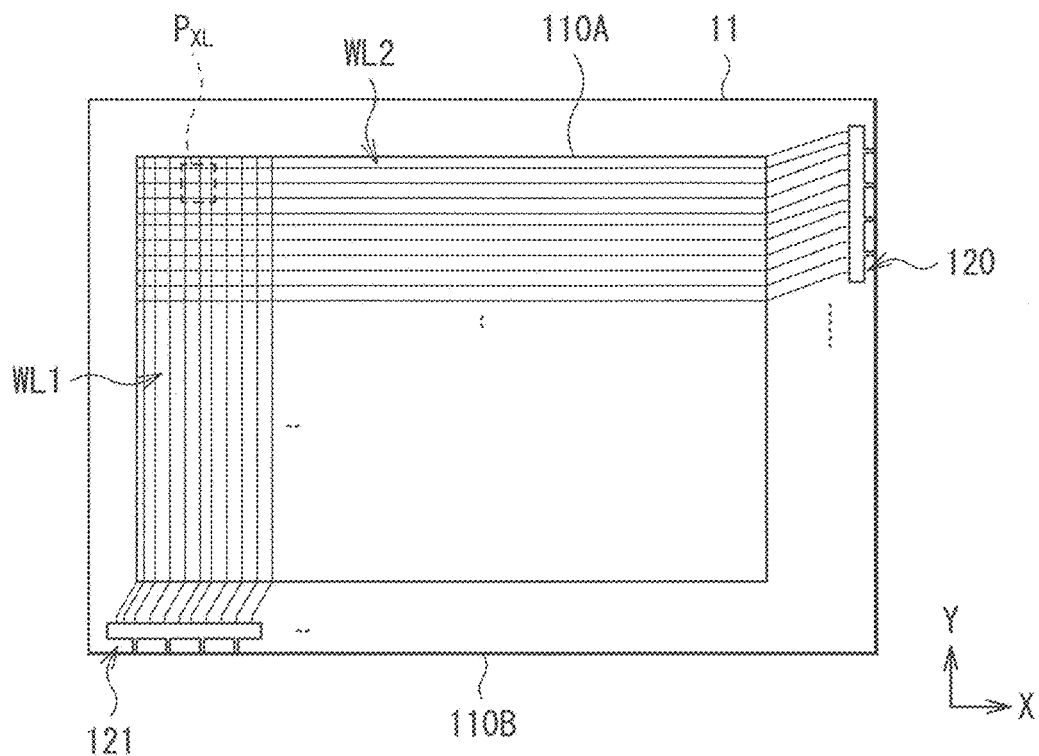
FIG. 3 is a schematic plan view of a display unit having an example wiring configuration according to one embodiment of the technology.

FIG. 3 is a schematic plan view of the display unit 1 having an example wiring or backplane configuration.

The display unit 1 may have a display region 110A on the substrate 11. Wiring lines WL1 may extend along the Y-axis, and wiring lines WL2 may extend along the X-axis. The display region 110A may be surrounded by a peripheral region 110B. Terminals 120 and 121 may be provided in the peripheral region 110B and supply a potential to the respective wiring lines WL1 and WL2.

The wiring lines WL1 and WL2 may each serve as any one of a signal line, a scanning line, a power line, or a common potential line, for example. A region around an intersection between each of the wiring lines WL1 and corresponding one of the wiring lines WL2 (e.g., a region surrounded by a dashed line in FIG. 3) may correspond to a single pixel $P_{XL}$. The wiring lines WL1 and WL2 may extend over the display region 110A to the peripheral region 110B, and may be coupled with the respective terminals 121 and 120 in the peripheral region 110B. The wiring lines WL2 may include common potential lines, which may be cathode lines, for example. The wiring lines WL2 may be coupled to the terminal 120 in the peripheral region 110B. The wiring line WL1 may serve as power lines or signal lines, for example.

The terminals 120 and 121 may supply the respective wiring lines WL1 and WL2 with a potential and may be electrically coupled to a non-illustrated power source. The terminal 120 may include a terminal section that supplies a fixed potential such as a cathode potential. In an example embodiment of the technology, the substrate 11 may have a rectangular shape, and the terminals 120 and 121 are respectively provided along two sides of the substrate 11. In another example embodiment of the technology, the terminals 120 and 121 may be provided along one side of the substrate 11 or three or four sides of the substrate 11.

Although the transistors Tr are not illustrated in FIG. 3, it is assumed that each pixel $P_{XL}$ may include corresponding one of the transistors Tr, in an example embodiment of the technology. Note that any number of the transistors Tr may be provided in another example embodiment of the technology: each pixel $P_{XL}$ may include two or more of the transistors Tr.

[Manufacturing Method]

The display unit 1 according to any example embodiment of the technology may be manufactured through the following procedure. FIG. 4A to FIG. 5C illustrate processes of an example procedure of manufacturing the display unit 1 in sequential order.

Figure 4A:
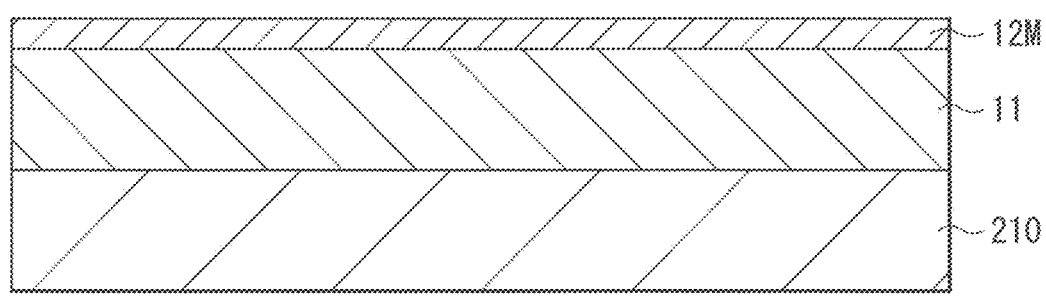
FIG. 4A is a schematic cross-sectional view of a display unit according to one embodiment of the technology for illustration of an example process of a manufacturing method of the display unit.

First, with reference to FIG. 4A, a support 210 may be attached to the rear surface of the substrate 11 that may be a flexible substrate. The support 210 may include a glass material, for example. Thereafter, an electrically-conductive film 12M may be formed on the substrate 11. The electrically-conductive film 12M may include a metal material, such as titanium, for example. The electrically-conductive film 12M may be formed by sputtering, for example.

Figure 4B:
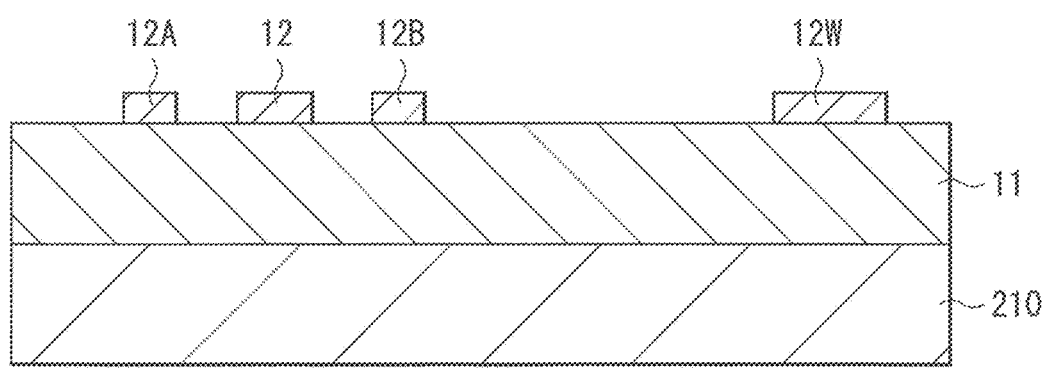
FIG. 4B is a schematic cross-sectional view of a display unit according to one embodiment of the technology for illustration of an example process following the process illustrated in FIG. 4A.

Thereafter, with reference to FIG. 4B, the electrically-conductive film 12M may be patterned into the second gate electrode 12, the source-drain electrodes 12A and 12B, and the wiring line 12W in the same process. The electrically-conductive film 12M may be patterned by photolithography or etching, for example.

Figure 5A:
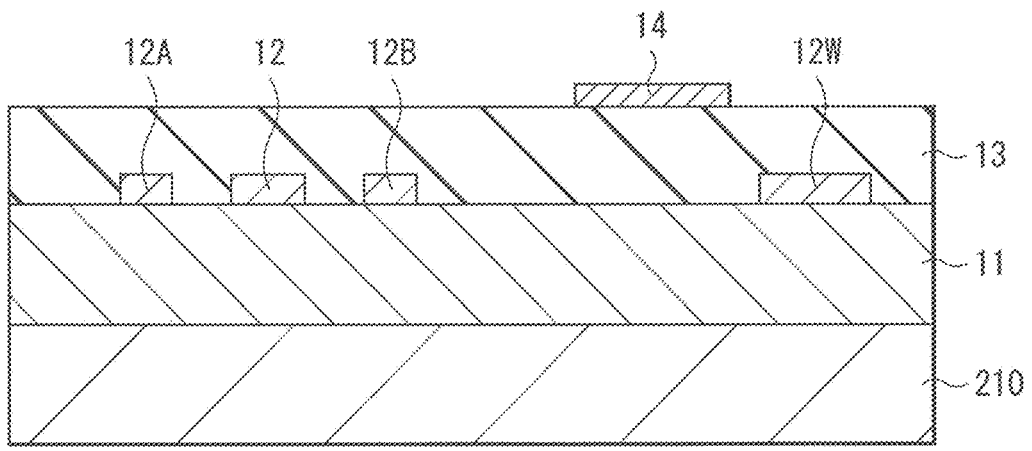
FIG. 5A is a schematic cross-sectional view of a display unit according to one embodiment of the technology for illustration of an example process following the process illustrated in FIG. 4B.

Thereafter, with reference to FIG. 5A, the organic insulating film 13 and the lower electrode 14 may be formed in this order. In an example embodiment of the technology, the organic insulating film 13 may be formed to cover the second gate electrode 12, the source-drain electrodes 12A and 12B, and the wiring line 12W. The organic insulating film 13 may be formed through applying an organic insulating material by spin coating, for example. Thereafter, a metal film may be formed on the organic insulating film 13 by sputtering, for example, and patterned into the lower electrode 14 by photolithography or etching, for example.

Figure 5B:
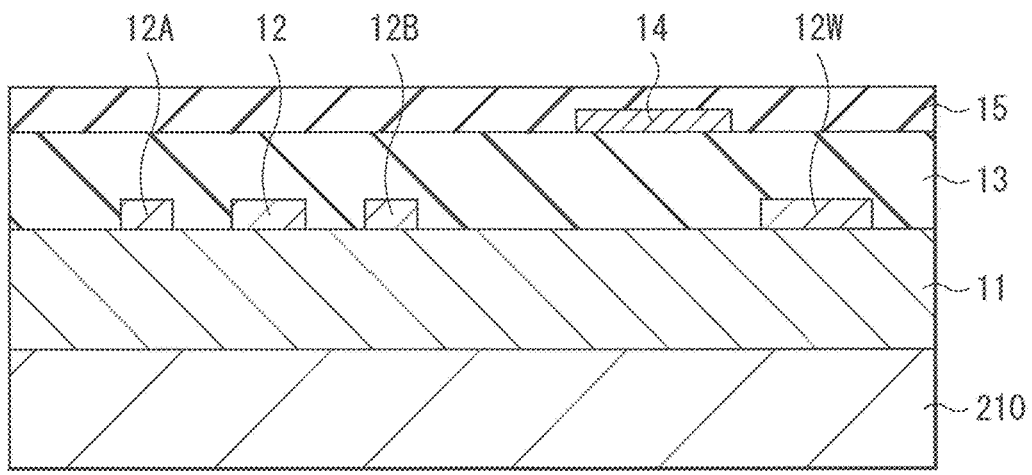
FIG. 5B is a schematic cross-sectional view of a display unit according to one embodiment of the technology for illustration of an example process following the process illustrated in FIG. 5A.

Thereafter, with reference to FIG. 5B, the inorganic insulating film 15 extending over the entire top surface of the substrate 11 may be formed to cover the lower electrode 14. The inorganic insulating film 15 may be formed by chemical vapor deposition (CVD), for example. After the formation of the inorganic insulating film 15, through-holes respectively extending to the source-drain electrodes 12A and 12B may be formed in the inorganic insulating film 15 and the organic insulating film 13.

Figure 5C:
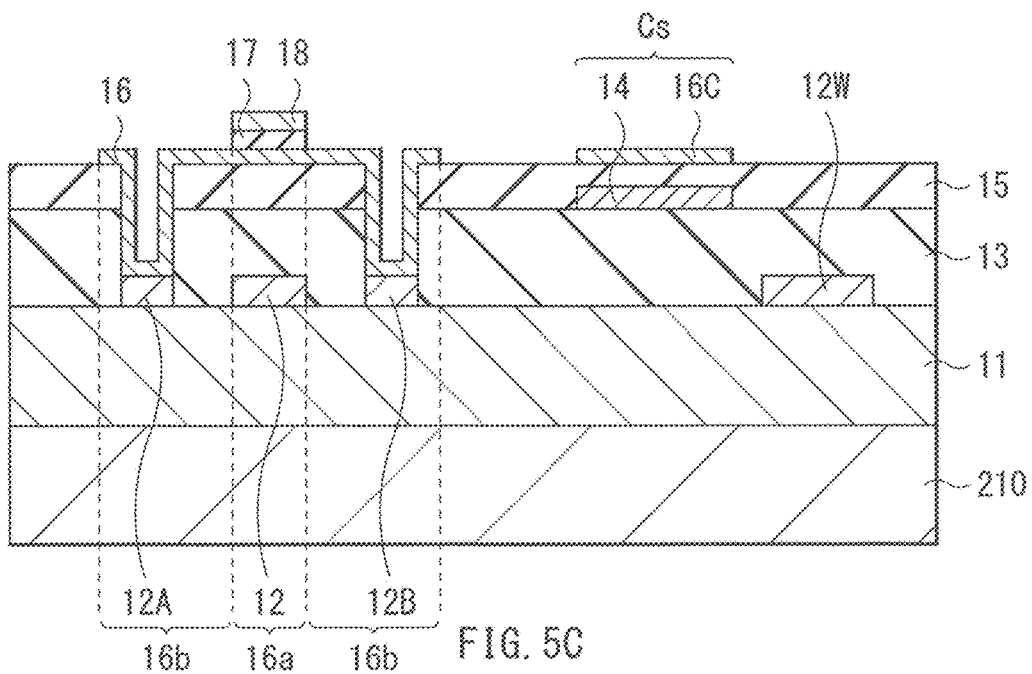
FIG. 5C is a schematic cross-sectional view of a display unit according to one embodiment of the technology for illustration of an example process following the process illustrated in FIG. 5B.

Thereafter the semiconductor film 16, the upper electrode 16C, the gate insulating film 17, and the first gate electrode 18 may be formed, as illustrated in FIG. 5C. For example, these films are formed as described below.

First, an oxide semiconductor material may be formed into a film on the inorganic insulating film 15 by sputtering, for example. The resultant oxide semiconductor film may be patterned into a predetermined shape by photolithography or etching to form the semiconductor film 16 and the upper electrode 16C in the same process. Thereafter, an inorganic insulating material may be formed into a film by CVD to cover the semiconductor film 16, for example. Thereafter, an electrically-conductive material may be formed into a film on the film including the inorganic insulating material by sputtering, for example. The film including the electrically-conductive material may be patterned into the first gate electrode 18 by photolithography or etching. Thereafter, the film including the inorganic insulating material may be etched into the gate insulating film 17, using the first gate electrode 18 as a mask. In an example embodiment of the technology, part of the semiconductor film 16 and the upper electrode 16C that are exposed without the gate insulating film 17 provided thereon may be processed to have a low resistance during the etching process.

After the formation of the gate insulating film 17 and the first gate electrode 18, an aluminum oxide ($Al_2O_3$) film extending over the entire top surface of the film substrate 11 may be formed by sputtering, for example. The aluminum oxide film may have a thickness of about 20 nm, for example, and serve as the protective film 19A. Thereafter, a photosensitive organic insulating material may be formed into a film extending over the entire top surface of the substrate 11. The resultant film may serve as the planarizing film 19B.

The first electrode 21, the element separation film 22, the organic layer 23, and the second electrode 24 may be formed in this order on the planarizing film 19B to produce the display element layer 20. Thereafter, the support 210 may be removed from the substrate 11 by irradiating the rear surface of the support 210 with a laser beam L, for example. This process is so-called laser lift-off (LLO) processing. After the removal of the support 210 from the substrate 11, an optional metal thin film may be attached to the rear surface of the substrate 11. The display unit 1 illustrated in FIG. 1, for example, may be manufactured through the procedure described above. In an example embodiment in which the substrate 11 includes a glass material, the display unit 1 may be manufactured without using the support 210.

[Workings and Effects]

In the display unit 1 according to any example embodiment of the technology, the pixels in the display element layer 20 may be driven to display an image on the basis of the external image signal. In such an embodiment, the transistors Tr in the semiconductor device 10 may be driven for each pixel by a voltage, for example. For example, when a voltage exceeding a threshold is applied to the first gate electrode 19 of the transistor Tr of any of the pixels, the corresponding channel region 16a of the semiconductor film 16 may be activated. In other words, a channel may be formed in the semiconductor film 16. This causes a current to flow between the paired source-drain electrodes 12A and 12B.

In the semiconductor device 10 according to any example embodiment of the technology, the thickness T2 of the second insulating layer (i.e., the inorganic insulating film 15) provided between the lower electrode 14 and the upper electrode 16C is smaller than the thickness T1 of the first insulating layer (i.e., the combination of the organic insulating film 13 and the inorganic insulating film 15) provided between the second gate electrode 12 and the semiconductor film 16. Therefore, even when the thickness T2 of the second insulating layer is reduced, it is possible to suppress a defect of the transistor Tr that may possibly be caused by the second gate electrode 12 and the semiconductor film 16 provided close to each other. Such an effect is described with reference to a comparative example in the following.

Figure 6:
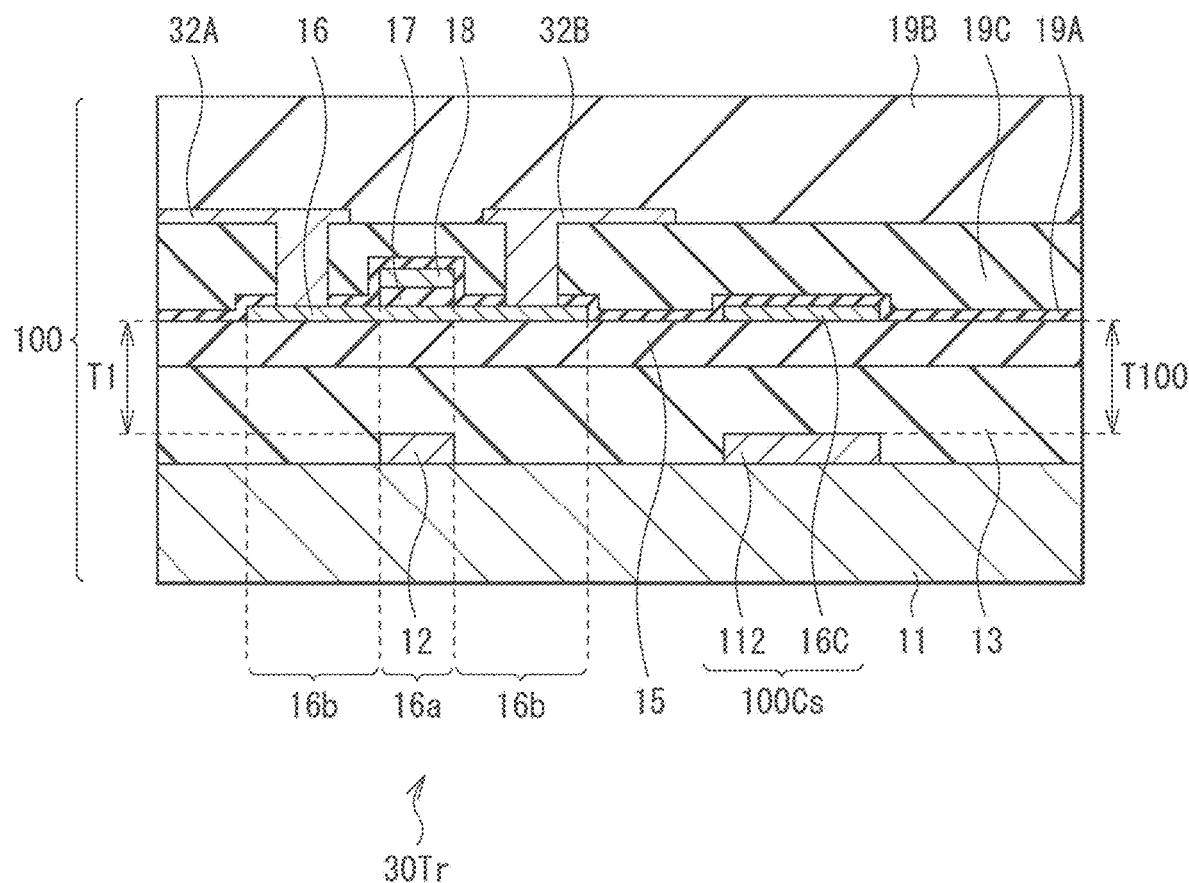
FIG. 6 is a schematic cross-sectional view of a semiconductor device according to a comparative example.

FIG. 6 is a schematic cross-sectional view of a semiconductor device 100 according to a comparative example. The semiconductor device 100 includes a transistor 30Tr and a storage capacitor capacitor 100Cs.

In the transistor 30Tr, source-drain electrodes 32A and 32B are provided in a layer upper than a semiconductor film 16. The semiconductor device 100 includes an interlayer insulating film 19C between a protective film 19A and a planarizing film 19B. The interlayer insulating film 19C extends over the entire top surface of the substrate 11. The source-drain electrodes 32A and 32B are provided on the interlayer insulating film 19C and covered with the planarizing film 19B. The source-drain electrodes 32A and 32B are coupled to respective low-resistive regions 16a of the semiconductor film 16 via respective through-holes of the interlayer insulating film 19C and the protective film 19A.

A lower electrode 112 of the storage capacitor 100Cs is provided in the same layer as a second gate electrode 12 of the transistor 30Tr. In detail, the lower electrode 112 is covered with the organic insulating film 13 and faces the upper electrode 16C across the organic insulating film 13 and the inorganic insulating film 15. In the storage capacitor 100Cs, an insulating layer provided between the lower electrode 112 and the upper electrode 16C has a thickness T100 that is the total thickness of the organic insulating film 13 and the inorganic insulating film 15. In other words, the thickness T100 is equal to the thickness T1 of the insulating layer provided between the second gate electrode 12 and the semiconductor film 16.

The thickness T100 should be reduced to increase the capacitance of the storage capacitor 100Cs for a high-definition semiconductor device, for example. In the semiconductor device 100, the organic insulating film 13 may be omitted for a purpose of suppressing leak current and reducing movable ions, for example. In such a case, only the inorganic insulating film 15 is provided between the lower electrode 112 and the upper electrode 16C and between the second gate electrode 12 and the semiconductor film 16. For the semiconductor device 100, such a reduction in the thickness T100 results in a reduction in the thickness T1. This brings the second gate electrode 12 and the semiconductor film 16 close to each other, which is likely to cause a defect.

For example, as the distance between the second gate electrode 12 and the semiconductor film 16 is reduced, sensitivity of the first gate electrode 18 decreases, and the mobility of the transistor 30Tr decreases. The reduction in the distance between the second gate electrode 12 and the semiconductor film 16 is also likely to cause a short circuit therebetween. This may possibly cause an adverse effect on a device yield. In a case where the second gate electrode 12 is not provided, a fluctuation in saturation current due to the drain voltage Vd-drain current Id characteristic is readily caused.

In contrast, in the semiconductor device 10 according to any example embodiment of the technology, the lower electrode 14 of the storage capacitor Cs may be provided in a different layer from the second gate electrode 12 of the transistor Tr. This configuration allows the thickness T2 of the second insulating layer provided between the lower electrode 14 and the upper electrode 16C to be smaller than the thickness T1 of the first insulating layer provided between the second gate electrode 12 and the semiconductor film 16. Accordingly, in the semiconductor device 10, an appropriate distance is defined between the second gate electrode 12 and the semiconductor film 16, even when the thickness T2 is reduced. Therefore, it is possible in the semiconductor device 10 to suppress a reduction in mobility of the transistor Tr and occurrence of a short circuit between the second gate electrode 12 and the semiconductor film 16.

Additionally, the transistor Tr may include the source-drain electrodes 12A and 12B that are provided in the same layer as the second gate electrode 12. This allows the source-drain electrodes 12A and 12B to be provided in the same process as the second gate electrode 12. Accordingly, it is possible to suppress an increase in a manufacturing cost despite that the lower electrode 14 is formed in a different process from the second gate electrode 12.

As described above, the lower electrode 14 is provided in the different layer from the second gate electrode 12, in the semiconductor device 10 according to any example embodiment of the technology. This configuration suppresses a reduction in the mobility of the transistor Tr and occurrence of a short circuit between the second gate electrode 12 and the semiconductor film 16, while increasing the capacitance of the storage capacitor Cs. Accordingly, it is possible to provide the second gate electrode 12 in the transistor Tr, while increasing the capacitance of the storage capacitor Cs. Furthermore, the configuration in which the source-drain electrodes 12A and 12B are provided in the same layer as the second gate electrode 12 suppresses an increase in a manufacturing cost.

In any example embodiment of the technology described above, the thickness T2 of the second insulating layer is smaller than the thickness T1 of the first insulating layer. Accordingly, it is possible to provide the second gate electrode 12 in the transistor Tr, while increasing the capacitance of the storage capacitor Cs. Therefore, it is possible to suppress a characteristic fluctuation of the transistor Tr, while increasing the capacitance of the storage capacitor Cs. The semiconductor device 10 provided with the storage capacitor Cs having a large capacitance is suitable for the high-definition display unit 1. The semiconductor device 10 that is less likely to cause a defect such as a short circuit has an increased device yield. Furthermore, suppressing a reduction in the mobility of the transistor Tr allows the transistor Tr to be downsized. This allows the display unit 1 to be a high-definition display unit with a narrow bezel.

Additionally, the configuration in which the source-drain electrodes 12A and 12B are provided in the same layer as the second gate electrode 12 suppresses an increase in the manufacturing cost.

Some modification examples of the technology will now be described. Note that the like elements are denoted with the same reference numerals, and any redundant description thereof are not described in detail.

Modification Examples

Figure 7:
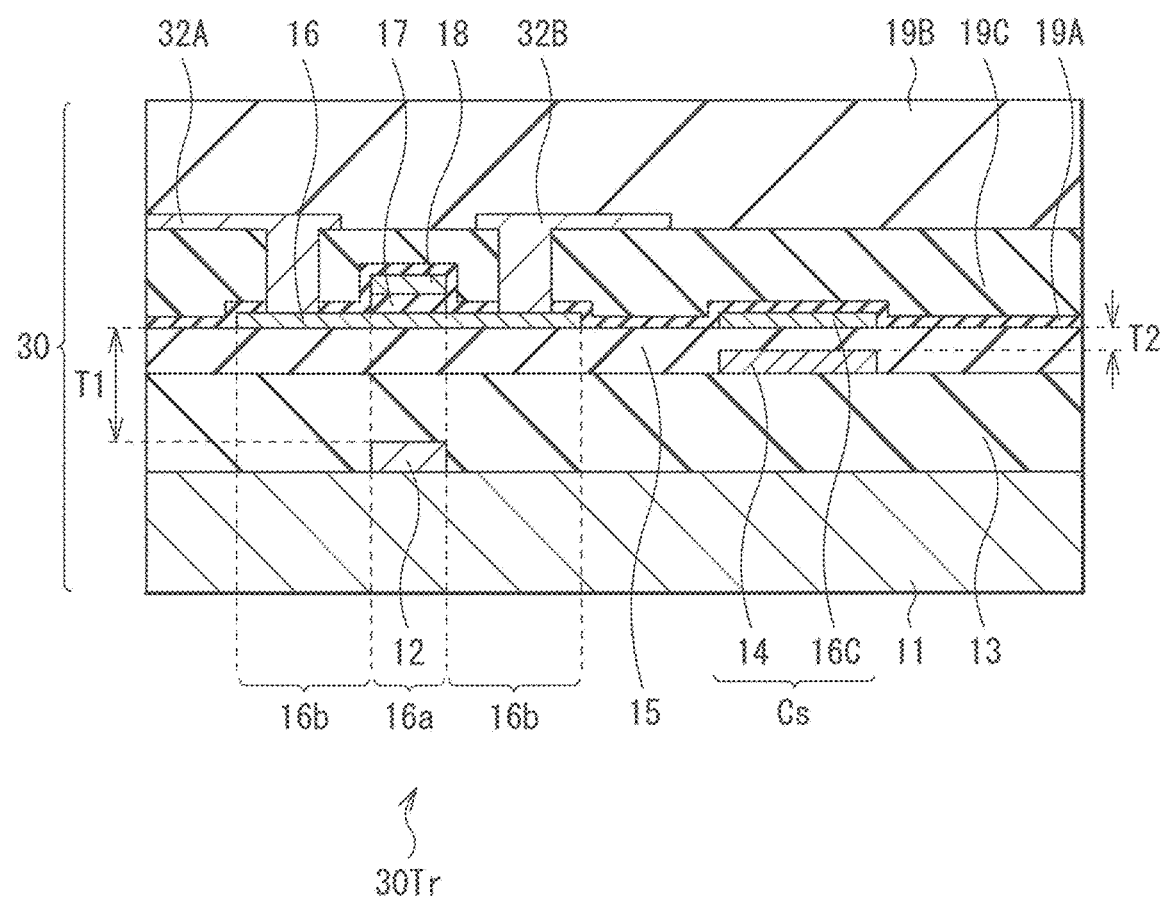
FIG. 7 is a cross-sectional view of a semiconductor device having an example configuration according to one modification example of the technology.

FIG. 7 is a cross-sectional view of a semiconductor device 30 having an example configuration according to a modification example of the technology. In a transistor 30Tr of the semiconductor device 30, the source-drain electrodes 32A and 32B may be provided in a different layer from the second gate electrode 12. Except this configuration, the semiconductor device 30 has the same configuration as the semiconductor device 10 according to any example embodiment of the technology. Workings and effects of the semiconductor device 30 may also be the same as those of the semiconductor device 10 according to any example embodiment of the technology.

The semiconductor device 30 may include the interlayer insulating film 19C between the protective film 19A and the planarizing film 19B. The interlayer insulating film 19C may extend over the entire top surface of the substrate 11. The source-drain electrodes 32A and 32B may be provided on the interlayer insulating film 19C, and the planarizing film 19B may cover the source-drain electrodes 32A and 32B. The source-drain electrodes 32A and 32B may be coupled to the respective low-resistive regions 16b of the semiconductor film 16 via the respective through-holes of the interlayer insulating film 19C and the protective film 19A.

As described above, the source-drain electrodes 32A and 32B may be provided in a different layer from the second gate electrode 12. It is also possible in this modification example to suppress a reduction in the mobility of the transistor 30Tr and occurrence of a short circuit between the second gate electrode 12 and the semiconductor film 16, while increasing the capacitance of the storage capacitor Cs, as in the semiconductor device 10 according to any example embodiment of the technology.

[Example Configurations of Display Unit]

Figure 8:
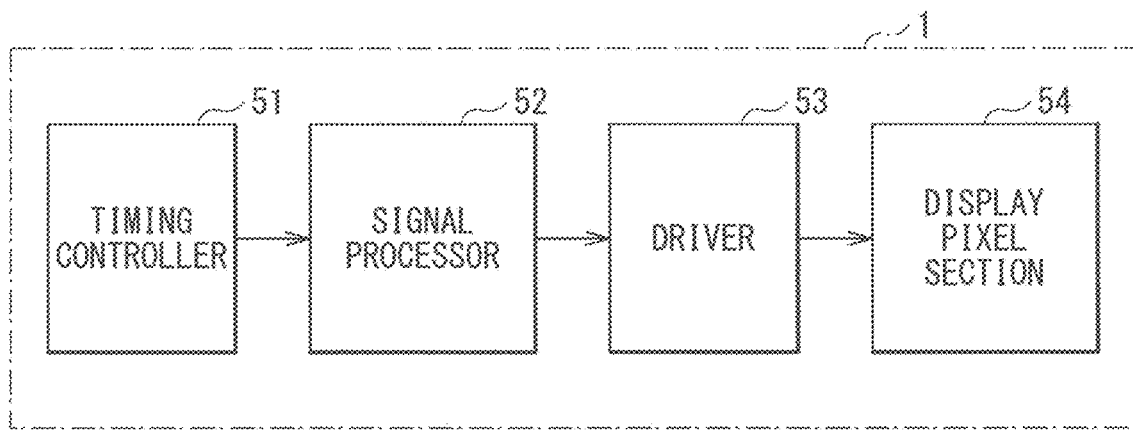
FIG. 8 is a block diagram of a display unit having an example configuration according to one embodiment of the technology.

FIG. 8 is a block diagram of the display unit 1 having an example configuration according to an example embodiment of the technology.

The display unit 1 may display an image based on an external or internal image signal. For example, the display unit 1 may be applied to a liquid crystal display as well as the organic EL display described above. The display unit 1 may include, for example, a timing controller 51, a signal processor 52, a driver 53, and a display pixel section 54.

The timing controller 51 may include a timing generator that generates various timing signals or control signals, and control driving of the signal processor 52 on the basis of these timing signals, for example. In an example embodiment of the technology, the signal processor 52 may perform a predetermined correction on a digital image signal received from an external device, and output the corrected image signal to the driver 53. The driver 53 may include a scanning-line driving circuit and a signal-line driving circuit, for example. The driver 53 may drive the pixels in the display pixel section 54 through respective control lines. The display pixel section 54 may include the display elements in the display element layer 20 and circuitry that drives the display elements for each pixel. The display elements may be organic EL elements or liquid crystal display elements, for example. The semiconductor device 10 or 30 according to any example embodiment of the technology may be applied to any circuitry in the driver 53 or the display pixel section 54, for example.

[Example Imaging Unit]

Figure 9:
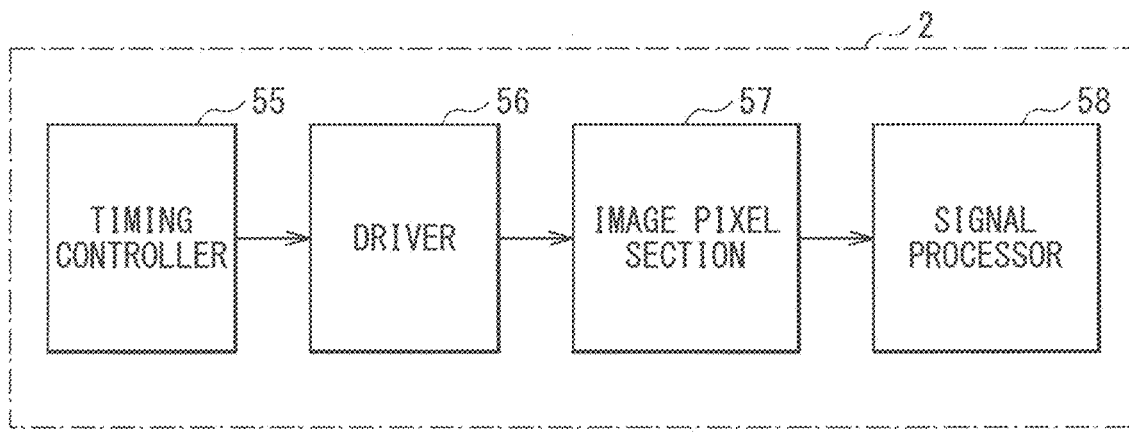
FIG. 9 is a block diagram of an imaging unit having an example configuration according to one embodiment of the technology.

In any example embodiment of the technology described above, the semiconductor device 10 or 30 is applied to the display unit 1. In addition to the display unit 1, the semiconductor device 10 or 30 may be applied to an imaging unit 2 illustrated in FIG. 9, for example.

The imaging unit 2 may be a solid-state imaging unit that acquires images in the form of electric signals, for example.

The imaging unit 2 may include a charge-coupled device (CCD) or a complementary metal oxide semiconductor (CMOS) image sensor. The imaging unit 2 may include a timing controller 55, a driver 56, an image pixel section 57, and a signal processor 58.

The timing controller 55 may include a timing generator that generates various timing signals or control signals, and control the driving of the driver 56 on the basis of these timing signals. The driver 56 may include a row-selection circuit, an AD conversion circuit, and a horizontal transfer scanning circuit, for example. The driver 56 may read a signal from any of the pixels in the image pixel section 57 through the corresponding control line. The image pixel section 57 may include an imaging element such as a photodiode (i.e., photoelectric conversion element) and a pixel circuit to read signals, for example. The signal processor 58 may perform various signal processing on the signal received from the image pixel section 57. The semiconductor device 10 or 30 according to any example embodiment of the technology may be applied to various circuits in the driver 56 or the image pixel section 57, for example.

[Example Electronic Apparatuses]

Figure 10:
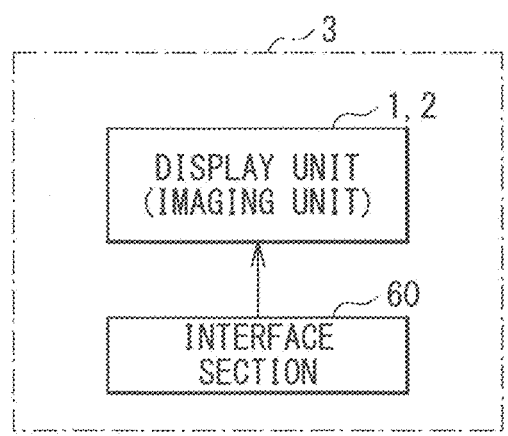
FIG. 10 is a block diagram of an electronic apparatus having an example configuration according to one embodiment of the technology.

The display unit 1 or the imaging unit 2 according to any example embodiment of the technology may be applied to a variety of electronic apparatuses. FIG. 10 is a block diagram of an electronic apparatus 3 having an example configuration according to any example embodiment of the technology. Specific but non-limiting examples of the electronic apparatus 3 may include television sets, personal computers (PCs), smartphones, tablet PCs, mobile phones, digital still cameras, and digital video cameras.

The electronic apparatus 3 may include, for example, the display unit 1 or the imaging unit 2 according to any example embodiment of the technology and an interface section 60. The interface section 60 may be an input section that receives various external signals and external electric power. Optionally, the interface section 60 may include, for example, a user interface section such as a touch panel, a keyboard, or operation buttons.

Although the technology has been described with reference to the example embodiments and modification examples, the technology is not limited thereto, but may be modified in a wide variety of ways. For example, factors such as a material and a thickness of each layer exemplified in any foregoing example embodiment, etc. are illustrative and non-limiting examples. Any other material and any other thickness may be adopted besides those described above.

According any example embodiment of the technology described above, the first insulating layer provided between the second gate electrode 12 and the semiconductor film 16 may be the combination of the organic insulating film 13 and the inorganic insulating film 15, and the second insulating layer provided between the lower electrode 14 and the upper electrode 16C may be the inorganic insulating film 15. However, the configurations of the first and second insulating layers should not be limited thereto. In another example embodiment of the technology, the first and second insulating layers may be inorganic insulating films that are different in thickness from each other. In still another example embodiment of the technology, the first insulating layer may be a laminate of three or more films. Alternatively, the second insulating layer may be a laminate of several films.

According to any example embodiment of the technology described above, the gate potential of the transistor Tr may be switched by the first gate electrode 18. In another example embodiment of the technology, the gate potential of the transistor Tr may be switched by the second gate electrode 12. In this embodiment, the first gate electrode 18 may have substantially the same size as the second gate electrode 12 in plan view, or may extend over a larger region than the second gate electrode 12 in plan view.

It should be appreciated that the effects described herein are mere examples. Effects of an embodiment of the technology are not limited to those described herein. The technology may further include any effect other than those described herein.

Furthermore, the technology encompasses any possible combination of some or all of the various embodiments and the modifications described herein and incorporated herein.

It is possible to achieve at least the following configurations from the above-described example embodiments of the technology.

(1) A semiconductor device including:
a substrate;
a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film;
a storage capacitor including a lower electrode and an upper electrode, the lower electrode and the upper electrode being provided in this order from the substrate, the upper electrode facing the lower electrode and including a material a same as a material of the semiconductor film;
a first insulating layer provided between the second gate electrode and the semiconductor film; and
a second insulating layer provided between the lower electrode and the upper electrode and having a thickness smaller than a thickness of the first insulating layer.

(2) The semiconductor device according to (1), in which the first insulating layer includes an organic insulating film and an inorganic insulating film, and
the second insulating film includes the inorganic insulating film.

(3) The semiconductor device according to (2), in which the thickness of the first insulating layer is a total thickness of the organic insulating film and the inorganic insulating film, and
the thickness of the second insulating layer is the thickness of the inorganic insulating film.

(4) The semiconductor device according to any one of (1) to (3), in which
the first insulating layer has a contact-hole, and
the transistor further includes a source-drain electrode that is electrically coupled to the semiconductor layer via the contact-hole of the first insulating layer.

(5) The semiconductor device according to (4), in which the source-drain electrode includes a material a same as a material of the second gate electrode.

(6) The semiconductor device according to any one of (1) to (5), in which the second gate electrode is held at a fixed potential.

(7) The semiconductor device according to any one of (1) to (6), in which the semiconductor film includes an oxide semiconductor material.

(8) The semiconductor device according to any one of (1) to (7), in which the first gate electrode has an end face that is aligned with an end face of the gate insulating film.

(9) The semiconductor device according to any one of (1) to (8), in which the second gate electrode has a planar shape a same as a planar shape of the first gate electrode.

(10) A display unit provided with a semiconductor device and a display element layer that is configured to be driven by the semiconductor device, the semiconductor device including:
a substrate;
a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film;
a storage capacitor including a lower electrode and an upper electrode, the lower electrode and the upper electrode being provided in this order from the substrate, the upper electrode facing the lower electrode and including a material a same as a material of the semiconductor film;
a first insulating layer provided between the second gate electrode and the semiconductor film; and
a second insulating layer provided between the lower electrode and the upper electrode and having a thickness smaller than a thickness of the first insulating layer.

(11) A semiconductor device including:
a substrate;
a transistor including a source-drain electrode, a semiconductor film, a gate insulating film, and a first gate electrode, the semiconductor film being electrically coupled to the source-drain electrode, the source-drain electrode, the semiconductor film, the gate insulating film, and the first gate electrode being provided in this order from the substrate; and
a storage capacitor including a lower electrode and an upper electrode, the lower electrode and the upper electrode being provided in this order from the substrate, the upper electrode facing the lower electrode and including a material the same as a material of the semiconductor film.

In the semiconductor device and the display unit of any example embodiment of the technology, the thickness of the second insulating layer is smaller than the thickness of the first insulating layer. Accordingly, an appropriate distance is defined between the second gate electrode and the semiconductor film in the transistor, even when the thickness of the second insulating layer is reduced. Therefore, it is possible in the transistor to suppress a defect due to the second gate electrode and the semiconductor film provided close to each other.

In the semiconductor device and the display unit according to any example embodiment of the technology, the thickness of the second insulating layer is smaller than the thickness of the first insulating layer. This allows the second gate electrode to be provided in the transistor, while increasing the capacitance of the storage capacitor. Accordingly, it is possible to suppress a characteristic fluctuation of the transistor, while increasing the capacitance of the storage capacitor.

Note that effects of the technology are not limited to those described above, and may be any effect described herein.

Although the technology has been described in terms of example embodiments and modification examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. Moreover, no element or component in this technology is intended to be dedicated to the public regardless of whether the element or component is explicitly recited in the following claims.

What is claimed is:

1. A semiconductor device comprising:
a substrate;
a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film;
a storage capacitor including a lower electrode and an upper electrode, the lower electrode and the upper electrode being provided in this order from the substrate, the upper electrode facing the lower electrode and including a material a same as a material of the semiconductor film;
a first insulating layer provided between the second gate electrode and the semiconductor film; and
a second insulating layer provided between the lower electrode and the upper electrode and having a thickness smaller than a thickness of the first insulating layer, wherein
the first insulating layer has a contact-hole, and
the transistor further includes a source-drain electrode that is electrically coupled to the semiconductor film via the contact-hole of the first insulating layer.

2. The semiconductor device according to claim 1, wherein
the first insulating layer includes an organic insulating film and an inorganic insulating film, and
the second insulating film includes the inorganic insulating film.

3. The semiconductor device according to claim 2, wherein
the thickness of the first insulating layer comprises a total thickness of the organic insulating film and the inorganic insulating film, and
the thickness of the second insulating layer comprises the thickness of the inorganic insulating film.

4. The semiconductor device according to claim 1, wherein the source-drain electrode includes a material a same as a material of the second gate electrode.

5. The semiconductor device according to claim 1, wherein the second gate electrode is held at a fixed potential.

6. The semiconductor device according to claim 1, wherein the semiconductor film includes an oxide semiconductor material.

7. The semiconductor device according to claim 1, wherein the first gate electrode has an end face that is aligned with an end face of the gate insulating film.

8. The semiconductor device according to claim 1, wherein the second gate electrode has a planar shape a same as a planar shape of the first gate electrode.

9. A display unit provided with a semiconductor device and a display element layer that is configured to be driven by the semiconductor device, the semiconductor device comprising:

a substrate;

a transistor including a semiconductor film, a gate insulating film, a first gate electrode, and a second gate electrode, the semiconductor film, the gate insulating film, and the first gate electrode being provided in this order from the substrate, the second gate electrode facing the first gate electrode across the semiconductor film;

a storage capacitor including a lower electrode and an upper electrode, the lower electrode and the upper electrode being provided in this order from the substrate, the upper electrode facing the lower electrode and including a material a same as a material of the semiconductor film;

a first insulating layer provided between the second gate electrode and the semiconductor film; and a second insulating layer provided between the lower electrode and the upper electrode and having a thickness smaller than a thickness of the first insulating layer, wherein the first insulating layer has a contact-hole, and the transistor further includes a source-drain electrode that is electrically coupled to the semiconductor film via the contact-hole of the first insulating layer.

10. The display unit according to claim 9 wherein the source-drain electrode includes a material a same as a material of the second gate electrode.

11. A semiconductor device comprising:

a substrate;

a transistor including a semiconductor film, a gate insulating film, a first gate electrode, a second gate electrode, and a source-drain electrode, wherein the source-drain electrode electrically coupled to the semiconductor film;

the second gate electrode facing the first gate electrode across the semiconductor film; and the semiconductor film, the gate insulating film and the first gate electrode being provided in this order from the substrate;

a first insulating layer provided between the second gate electrode and the semiconductor film, wherein the first insulating layer has a contact-hole, and the source-drain electrode extends through the contact-hole.

* * * * *